United States Patent
Tsutsumi

(10) Patent No.: US 7,786,513 B2
(45) Date of Patent: Aug. 31, 2010

(54) SEMICONDUCTOR INTEGRATED CIRCUIT DEVICE AND POWER SOURCE WIRING METHOD THEREFOR

(75) Inventor: Masanori Tsutsumi, Kyoto (JP)

(73) Assignee: Panasonic Corporation, Osaka (JP)

( * ) Notice: Subject to any disclaimer, the term of this patent is extended or adjusted under 35 U.S.C. 154(b) by 82 days.

(21) Appl. No.: 11/712,974

(22) Filed: Mar. 2, 2007

(65) Prior Publication Data
US 2007/0210405 A1    Sep. 13, 2007

(30) Foreign Application Priority Data
Mar. 8, 2006   (JP)   ............... 2006-062460

(51) Int. Cl.
*H01L 27/118* (2006.01)
(52) U.S. Cl. .............. 257/203; 257/E21.627; 257/E21.641; 365/52; 365/71; 365/72
(58) Field of Classification Search ........... 716/10; 257/499, 211, E21.627, E21.641, 203; 365/52, 365/71, 72
See application file for complete search history.

(56) References Cited

U.S. PATENT DOCUMENTS

| | | | | |
|---|---|---|---|---|
| 6,445,017 B2 * | 9/2002 | Song | ............. | 257/204 |
| 6,774,412 B2 * | 8/2004 | Komaki | ............. | 257/207 |
| 6,838,713 B1 * | 1/2005 | Gheewala et al. | ............. | 257/211 |
| 6,928,632 B2 * | 8/2005 | Wachi | ............. | 716/14 |
| 2005/0104133 A1 * | 5/2005 | Kanno et al. | ............. | 257/371 |
| 2006/0102934 A1 * | 5/2006 | Kanno et al. | ............. | 257/204 |
| 2007/0033562 A1 * | 2/2007 | Correale et al. | ............. | 716/10 |

FOREIGN PATENT DOCUMENTS

| | | |
|---|---|---|
| JP | 05-343518 | 12/1993 |
| JP | 06-204435 | 7/1994 |
| JP | 2-751742 | 2/1998 |

* cited by examiner

*Primary Examiner*—Thanh V Pham
*Assistant Examiner*—Caleb Henry
(74) *Attorney, Agent, or Firm*—McDermott Will & Emery LLP

(57) ABSTRACT

In a semiconductor integrated circuit device, from a first power source strap supplying a potential to a first standard cell receiving a supply of the potential, the potential is supplied via a first cell power source line having a constant width. The width of the first cell power source line is determined in accordance with power consumed by the first standard cell and with the number of standard cells that can be placed between the first power source strap and a third power source strap.

4 Claims, 5 Drawing Sheets

SEMICONDUCTOR INTEGRATED CIRCUIT DEVICE AND POWER SOURCE WIRING METHOD THEREFOR

BACKGROUND OF THE INVENTION

1. Field of the Invention

The present invention relates to a semiconductor integrated circuit device composed of standard cells arranged therein and to a power source wiring method for the semiconductor integrated circuit device.

2. Description of the Prior Art

In recent years, as digital circuits have become higher in speed and functionality, semiconductor integrated circuit devices have also become increasingly higher in speed and integration degree. To increase the integration degree of a semiconductor integrated circuit device, a fabrication process therefor has been scaled down year after year and, consequently, the width of a signal line used in the semiconductor integrated circuit device has been increasingly reduced. In addition, the increased speed of the semiconductor integrated circuit device has increased an amount of a current flowing in the signal line. Thus, when the width of the signal line has been reduced and the amount of the current has increased, the density of a current in wiring in the semiconductor integrated circuit device has increased so that a break in wiring and a short circuit therein due to electromigration have caused problems.

On the other hand, with the increase in the speed of the semiconductor integrated circuit device, it has become important to reduce variations (clock skew) in the delay of a clock signal in the semiconductor integrated circuit. The clock skew is the difference between the arrival times of the clock signal at two flip-flops operating in synchronization. When the clock skew is large, it may cause a reduction in operating frequency and even the misoperation of a circuit.

As a technology for reducing the clock skew, there is used a technique termed a clock tree which forms a tree-like clock distribution path with a plurality of relay buffers and distributes the clock from a clock supply source to the flip-flops. The clock tree reduces the clock skew by constructing a semiconductor integrated circuit device such that wiring lengths from the clock supply source to the terminal flip-flops are equal (see, e.g., Japanese Laid-Open Patent Publication No. HEI 6-204435).

Even in such a clock tree with equal wiring lengths, when wiring capacitances are different under the influence of surrounding wiring lines or the gate capacitances of cells driven by the relay buffers are different, the clock skew undesirably occurs depending on a delay in the clock tree portion. Therefore, it is important in reducing the clock skew to minimize the delay time in the clock tree portion. Because the relay buffers drive a large number of flip-flops and long wiring lines in the clock tree, a load to be driven is extremely high. Accordingly, to reduce the delay time in the clock tree portion, it is necessary to increase the size of each transistor.

In general, when the size of a transistor is increased, an amount of a current flowing in each of the source and drain thereof increases. As a result, the density of a current in wiring increases so that electromigration causes a problem when the current density exceeds a given threshold. To reduce the current density, it can be considered to increase a power source wiring width and a signal wiring width in accordance with a standard cell which consumes highest power. However, when these wiring widths are increased, a wiring area needed by signal lines increases. This may possibly cause an increase in the area of the semiconductor integrated circuit device and a short circuit in signal wiring due to wiring congestion.

To prevent this, there is proposed a semiconductor integrated circuit device constructed by preparing plural types of standard cells for which power source lines have different widths in accordance with, e.g., the positions at which they are placed (specifically, distances from power source straps) and with the minimum current capacitance of ground wiring and combining these standard cells to prevent an area increase and wiring congestion, while reducing the current density (see, e.g., Japanese Patent Publication No. 2751742).

However, the semiconductor integrated circuit device in which the widths of power source lines are varied depending on the positions at which they are placed does not necessarily lead to effective prevention of electromigration.

For example, there is a case where a standard cell for driving a clock signal is placed at the middle between the power source straps in order to construct a clock tree with equal wiring lengths. In this case, even though the standard cell at the middle portion is composed of large-size transistors, the width of the power source line is smaller at the middle portion between the power source straps so that the current density in the power source line increases undesirably.

SUMMARY OF THE INVENTION

The present invention has been achieved in view of the problem mentioned above and it is therefore an object of the present invention to provide a semiconductor integrated circuit device which allows prevention of electromigration, while providing a large region for signal lines.

To solve the problem mentioned above, an aspect of the present invention is a semiconductor integrated circuit device composed of standard cells arranged therein, the semiconductor integrated circuit device comprising: a first power source strap supplying a first potential; a second power source strap placed in parallel relation with the first power source strap and supplying a second potential; a third power source strap placed between the first and second power source straps in parallel relation therewith and supplying a third potential; a first standard cell placed between the first and third power source straps and driven with the first and third potentials; a second standard cell placed between the second and third power source straps and driven with the second and third potentials; a first cell power source line placed between the first and third power source straps in orthogonal relation to the first power source straps and supplying the first potential from the first power source strap to the first standard cell; a second cell power source line placed between the second and third power source straps in orthogonal relation to the second power source strap and supplying the second potential from the second power source strap to the second standard cell; a third cell power source line placed between the first and third power source straps in orthogonal relation to the first power source strap and supplying the third potential from the third power source strap to the first standard cell; and a fourth cell power source line placed between the second and third power source straps in orthogonal relation to the second power source strap and supplying the third potential from the third power source strap to the second standard cell, wherein a width of each of the first and third cell power source lines is determined in accordance with power consumed by the first standard cell, a width of each of the second and fourth cell power source lines is determined in accordance with power consumed by the second standard cell, and a wiring width of the first cell power source line between the first power source strap and the first standard cell, a wiring width of the second cell power source line between the second power source strap and the second standard cell, a wiring width of the third cell power source line between the third power source strap and the first standard cell, and a wiring width of the fourth cell power source line between the third power source strap and the second standard cell are each constant.

DETAILED DESCRIPTION OF THE PREFERRED EMBODIMENTS

Figure 1:
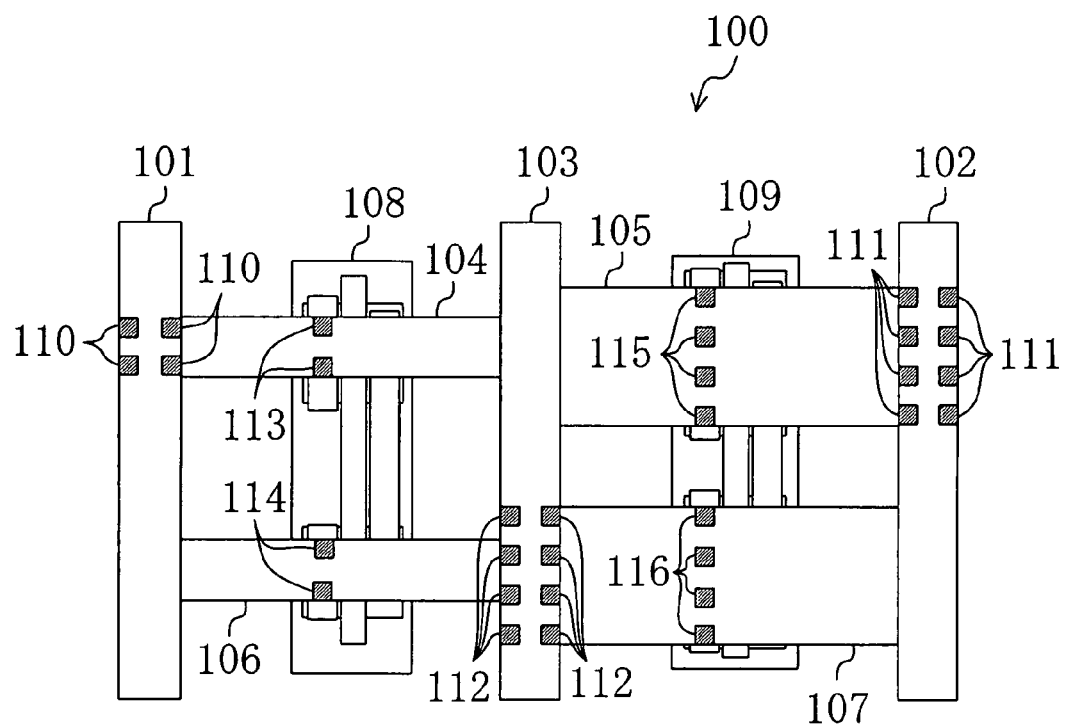
FIG. 1 is a layout diagram showing a structure of a semiconductor integrated circuit device according to a first embodiment of the present invention.

Referring to the drawings, the embodiments of the present invention will be described herein below. In the following description of the individual embodiments, the description of components having the same functions as the components that have been described once will be omitted by retaining the same reference numerals.

Embodiment 1

FIG. 1 is a layout diagram showing a structure of a semiconductor integrated circuit device 100 according to the first embodiment of the present invention. As shown in the drawing, the semiconductor integrated circuit device 100 comprises: a first power source strap 101; a second power source strap 102; a third power source strap 103; a first cell power source line 104; a second cell power source line 105; a third cell power source line 106; a fourth cell power source line 107; a first standard cell 108, a second standard cell 109; and contacts 110 to 116. First, a description will be given to the positional relations among the individual components placed in the semiconductor integrated circuit device 100 and the like.

The first, second, and third power source straps 101, 102, and 103 are placed in the same wiring layer.

The first and second power source straps 101 and 102 are power source lines each for supplying a first potential (e.g., VDD). The first and second power source straps 101 and 102 are placed in parallel with each other.

The third power source strap 103 is a power source line for supplying a second potential (e.g., VSS). The third power source strap 103 is placed between the first and second power source straps 101 and 102 in parallel relation with the first power source strap 101 (the third power source strap 103 is therefore also in parallel relation with the second power source strap 102).

The first, second, third, and fourth cell power source lines 104, 105, 106, and 107 are placed in the same wiring layer. The wiring layer in which the first, second, third, and fourth cell power source lines 104, 105, 106, and 107 are placed is different from the wiring layer in which the first power source strap 101 is placed.

The first cell power source line 104 is placed between the first and third power source straps 101 and 103 to extend in a direction orthogonal to the first power source strap 101. The first cell power source line 104 is electrically connected to the first power source strap 101 via the contacts 110. Accordingly, the first cell power source line 104 supplies the first potential.

The second cell power source line 105 is constructed to be wider than the first cell power source line 104. The second cell power source line 105 is placed between the second and third power source straps 102 and 103 to extend in a direction orthogonal to the second power source strap 102. The second cell power source line 105 is electrically connected to the second power source strap 102 via the contacts 111. Accordingly, the second cell power source line 105 supplies the first potential.

The third cell power source line 106 is placed between the first and third power source straps 101 and 103 to extend in a direction parallel with the first cell power source line 104. In the present embodiment, the third cell power source line 106 has the same wiring width as the first cell power source line 104.

The fourth cell power source line 107 is placed between the second and third power source straps 102 and 103 to extend in a direction parallel with the second cell power source line 105. In the present embodiment, the fourth cell power source line 107 has the same wiring width as the second cell power source line 105. The fourth cell power source line 107 extends to the left end of the third power source strap 103 (i.e., the third power source strap 103 and the fourth cell power source line 107 have an overlapping portion corresponding to the wiring width of the third power source strap 103 therebetween).

The third and fourth cell power source lines 106 and 107 are electrically connected to the third power source strap 103 each via the contacts 112. That is, the third and fourth cell power source lines 106 and 107 are connected to the third power source strap 103 by sharing the contacts 112.

As a result, the third and fourth cell power source lines 106 and 107 supplies the second potential. In the present embodiment, the fourth cell power source line 107 has the contacts 112 arranged in accordance with the width of the fourth cell power source line 107. Because the fourth cell power source line 107 is wider than the first cell power source line 104, the number of the contacts 112 that can be placed at the intersection point between the fourth cell power source line 107 and the third power source strap 103 is larger than the number of the contacts 110.

The first standard cell 108 is placed between the first and third power source straps 101 and 103. The first standard cell 108 is connected to the first cell power source line 104 via the contacts 113 and is also connected to the third cell power source line 106 via the contacts 114. As a result, the first standard cell 108 receives a supply of the first potential from the first cell power source line 104 and also receives a supply of the second potential from the third cell power source line 106.

The second standard cell 109 is placed between the second and third power source straps 102 and 103. The second standard cell 109 is connected to the second cell power source line 105 via the contacts 115 and is also connected to the fourth cell power source line 107 via the contacts 116. As a result, the second standard cell 109 receives a supply of the first potential from the second cell power source line 105 and also receives a supply of the second potential from the fourth cell power source line 107.

In the present embodiment, the second standard cell 109 is specifically an inverter-type standard cell having the function of, e.g., supplying a clock signal. For the purpose of reducing a delay time or the like, each transistor in the second standard cell 109 is formed to be larger in size than each transistor in the first standard cell 108 to be capable of driving a higher load. Consequently, the second standard cell 109 consumes higher power than the first standard cell 108.

In the present embodiment, a standard cell which consumes power lower than a specified value will be referred to as a low-load driving standard cell and a standard cell which consumes power higher than the specified value will be referred to as a high-load driving standard cell.

The semiconductor integrated circuit device 100 described above is designed under the following conditions. That is, from each power source strap supplying a potential to each standard cell receiving a supply of the potential, the potential is supplied via a cell power source line having a constant width. The width of the cell power source line is determined in accordance with power consumed by the standard cell and with the number of standard cells that can be placed between power source straps. For example, the wiring width of the first cell power source line 104 is determined in accordance with the power consumed by the first standard cell 108 and is constant throughout the entire length thereof.

In the present embodiment, the second standard cell 109 consumes higher power than the first standard cell 108 so that the second cell power source line 105 is formed to have a wiring width larger than (e.g., about double) that of the first cell power source line 104. The wiring width of the second cell power source line 105 is also constant throughout the entire length thereof.

The design of the semiconductor integrated circuit device 100 is specifically performed by preparing a standard cell library including the first standard cell 108 (low-load driving standard cell) and the second standard cell 109 (high-load driving standard cell) and then placing the standard cells included in the standard cell library.

Figure 2:
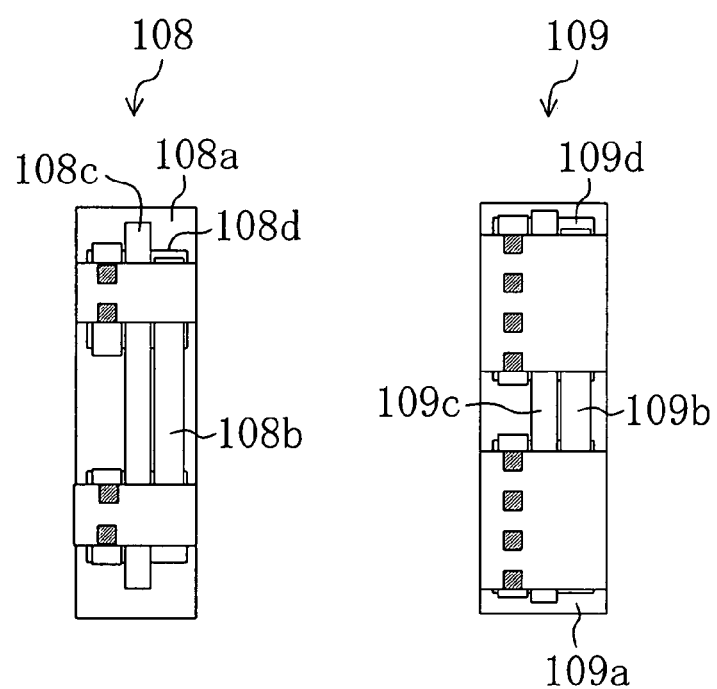
FIG. 2 shows an example of a structure of each of a first standard cell 108 and a second standard cell 109.

FIG. 2 shows an example of a structure of each of the first and second standard cells 108 and 109. In FIG. 2, each of 108a and 109a denotes a substrate, each of 108b and 109b denotes a metal line, each of 108c and 109c denotes polysilicon, and each of 108d and 109d denotes a diffusion region. In this example, an inverter including one P-channel transistor and one N-channel transistor is formed in each of the standard cells.

In each of the standard cells of FIG. 2, the cell power source lines extend to the left and right cell boundaries. The cell power source lines are also placed to be equidistant from the upper (or lower) cell boundary. Therefore, by placing the individual low-load driving standard cells such that the left and right cell boundaries thereof are in contact with each other and placing the individual high-load driving standard cells such that the left and right cell boundaries thereof are in contact with each other, the cell power source lines in the cells are connected to each other.

Thus, in the present embodiment, the width of each of the cell power source lines is determined in accordance with the power consumed by each of the standard cells. From the power source straps supplying potentials to the standard cells receiving supplies of the potentials, the potentials are supplied via the cell power source lines having the determined widths. Therefore, the present embodiment can prevent electromigration by reducing a current density in each of the cell power source lines.

In addition, the number of the contacts that can be placed at the intersection point between the fourth cell power source line 107 and the third power source strap 103 is larger than the number of the contacts that can be placed at the intersection point between the first power source strap 101 and the first cell power source line 104. As a result, the current density at each of the contacts can be easily reduced.

Moreover, since the widths of the cell power source lines are smaller between the power source straps between which the low-load driving standard cell is placed than between the power source straps between which the high-load driving standard cell is placed, it is possible to provide a large region for other signal lines.

Embodiment 2

Figure 3:
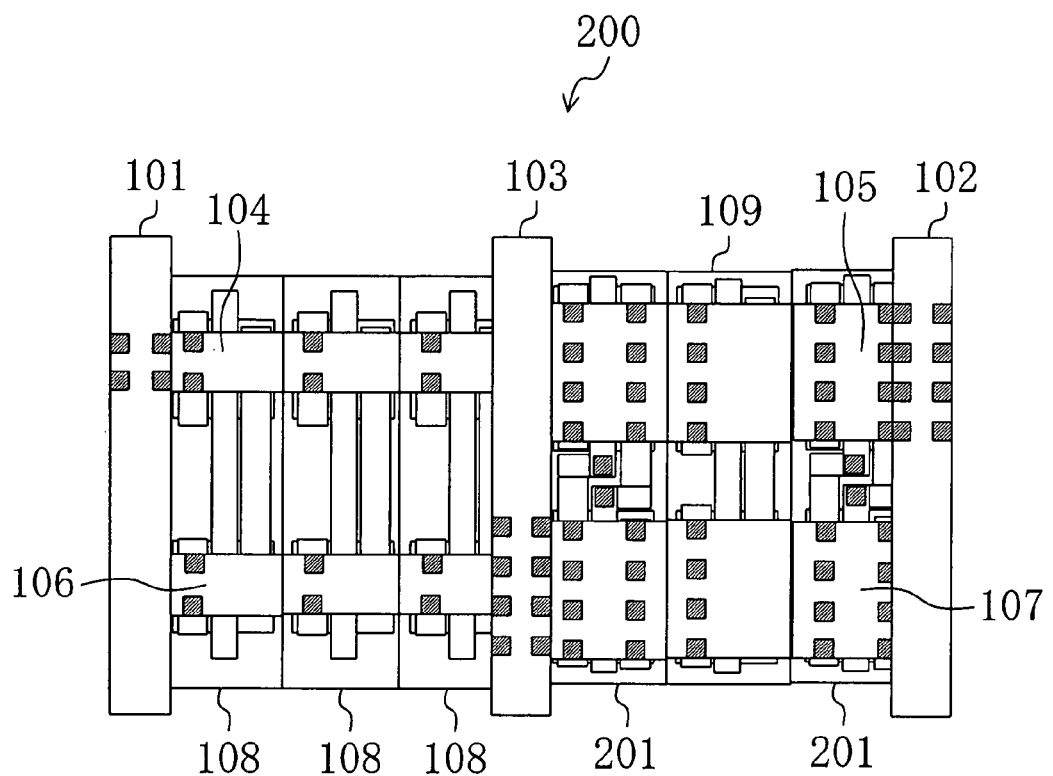
FIG. 3 is a layout diagram showing a structure of a semiconductor integrated circuit device according to a second embodiment of the present invention.

FIG. 3 is a layout diagram showing a structure of a semiconductor integrated circuit device 200 according to the second embodiment of the present invention. As shown in the drawing, the semiconductor integrated circuit device 200 comprises: the first power source strap 101; the second power source strap 102; the third power source strap 103, the first cell power source line 104; the second cell power source line 105; the third cell power source line 106; the fourth cell power source line 107; the first standard cells 108; the second standard cell 109; the contacts 110 to 116; and decoupling capacitor cells 201.

Each of the decoupling capacitor cells 201 is a standard cell comprising a decoupling capacitor in which a capacitance is formed by using a gate oxide film. The decoupling capacitor cells 201 are connected to the second cell power source line 105 via contacts 202 and also connected to the fourth cell power source line 107 via contacts 203. As a result, each of the decoupling capacitor cells 201 receives a supply of the first potential from the second cell power source line 105 and also receives a supply of the second potential from the fourth cell power source line 107.

The semiconductor integrated circuit device 200 described above is designed under the following conditions.

First, the number of standard cells placed between one pair of power source straps to receive supplies of potentials is limited to a specified number. It is to be noted that the target of the number limit is only a standard cell which consumes power of not less than a specified value. For example, a standard cell comprising only a capacitor and a standard cell having no internal transistor, which is termed a filler cell, is out of the target. In the present embodiment, it is assumed that the maximum number of low-load driving standard cells that can be placed is three and only one high-load driving standard cell can be placed. As a result, the three first standard cells 108 are placed between the first and third power source straps 101 and 103 and the only one second standard cell 109 is placed between the second and third power source straps 102 and 103.

In the semiconductor integrated circuit device 200, the decoupling capacitor cells 201 are densely placed with no gap therebetween in a vacant space between the power source straps between which the second standard cell 109 is placed.

Second, from each power source strap supplying a potential to each standard cell receiving a supply of the potential, the potential is supplied via a cell power source line having a constant width. The width of the cell power source line is determined in accordance with power consumed by the standard cell and with the number of standard cells that can be placed between power source straps. For example, the wiring width of the first cell power source line 104 is determined in accordance with the total power consumed by the three first standard cells 108 (low-load driving standard cells). On the other hand, the wiring width of the second cell power source line 105 is determined in accordance with the power consumed by the one second standard cell 109 (high-load driving standard cell).

In the design of the semiconductor integrated circuit device 200, a standard cell library including the first standard cells 108, the second standard cell 109, and the decoupling capacitor cells 201 is prepared. The design is performed by placing the standard cells included in the standard cell library.

Figure 4:
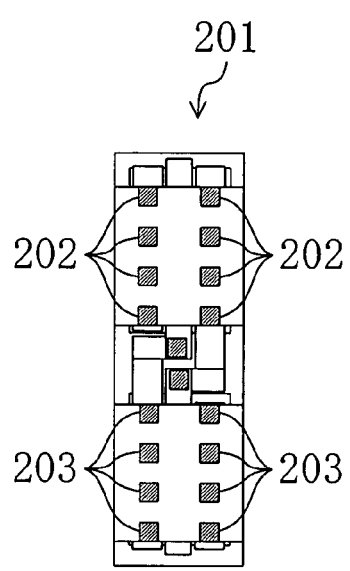
FIG. 4 shows an example of a structure of a decoupling capacitor cell 201.

FIG. 4 shows an example of a structure of each of the decoupling capacitor cells 201. As shown in FIG. 4, the cell power source lines in the decoupling capacitor cell 201 extend to the left and right cell boundaries. The cell power source lines are also placed in the decoupling capacitor cell 201 such that the distances thereof from the upper (or lower) cell boundary are equal to the distances of the cell power source lines in the standard cell 109 from the upper (or lower) cell boundary thereof. Therefore, by placing the decoupling capacitor cell 201 and the high-load driving standard cell such that the left and right cell boundaries thereof are in contact with each other or placing the individual decoupling capacitor cells 201 such that the left and right cell boundaries thereof are in contact with each other, the cell power source lines in the cells are connected to each other.

When the position at which the second standard cell 109 is placed is limited for the purpose of, e.g., eliminating skew or the like, the second standard cell 109 is placed first priority. Then, the decoupling capacitor cells 201 are placed second priority in the vacant space between the power source straps between which the second standard cell 109 is placed.

By thus preventing the other standard cells from being placed between the power source straps, even when the other standard cells are automatically placed, it is possible to prevent the other high-load driving standard cell and low-load driving standard cells from being placed aside the second standard cells 109.

In the present embodiment thus constructed also, it is possible to relieve wiring congestion, while preventing electromigration by reducing the current density in each of the cell power source lines.

In addition, it is also possible to supplement the current flowing in the second standard cell 109 even from the decoupling capacitor cells 201. This allows a further reduction in the current density in each of the cell power source lines and more effective prevention of electromigration.

Although the decoupling capacitor cells 201 are placed in the vacant space in the semiconductor integrated circuit device 200, it is also possible to place, e.g., cells having no internal transistor, which are termed filler cells. In the filler cells, cell power source lines having the same widths as the cell power source lines for the high-load driving standard cell are placed.

Embodiment 3

In the third embodiment, a description will be given to an example of a semiconductor integrated circuit device in which a large region can be provided for other signal lines. The semiconductor integrated circuit device according to the third embodiment is different from the semiconductor integrated circuit device 200 in that decoupling capacitor cells 301 or decoupling capacitor cells 302 (see FIG. 5), instead of the decoupling capacitor cells 201, are placed in the vacant space between the power source straps between which the second standard cell 109 is placed.

Figure 5:
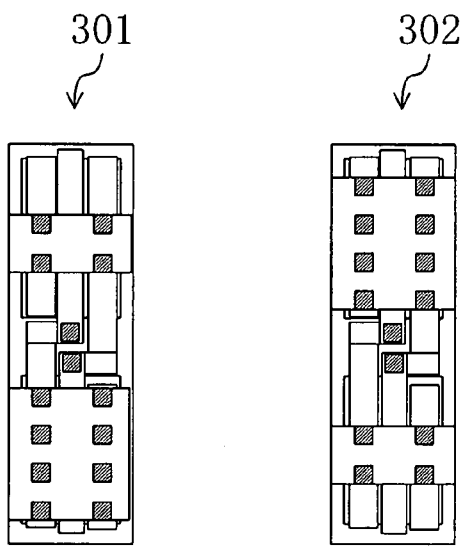
FIG. 5 shows an example of a structure of each of decoupling capacitor cells 301 and 302.

Each of the decoupling capacitor cells 301 and 302 is a standard cell comprising a decoupling capacitor in which a capacitance is formed by using a gate oxide film. As shown in FIG. 5, in the decoupling capacitor cell 301, one of cell power source lines is wider than the other of the cell power source lines. Specifically, the wider cell power source line has the same width as the cell power source line supplying the potential to the second standard cell 109. As also shown in FIG. 5, the positional relationship between the two types of cell power source lines in the decoupling capacitor cell 302 is vertically reverse to the positional relationship between the cell power source lines in the decoupling capacitor cell 301.

In the present embodiment, the decoupling capacitor cells are selected and placed together with the high-load driving standard cell such that the wider cell power source line is provided only between the power source strap and the high-load driving standard cell and the wider cell power source line is not provided at the other portion.

Figure 6:
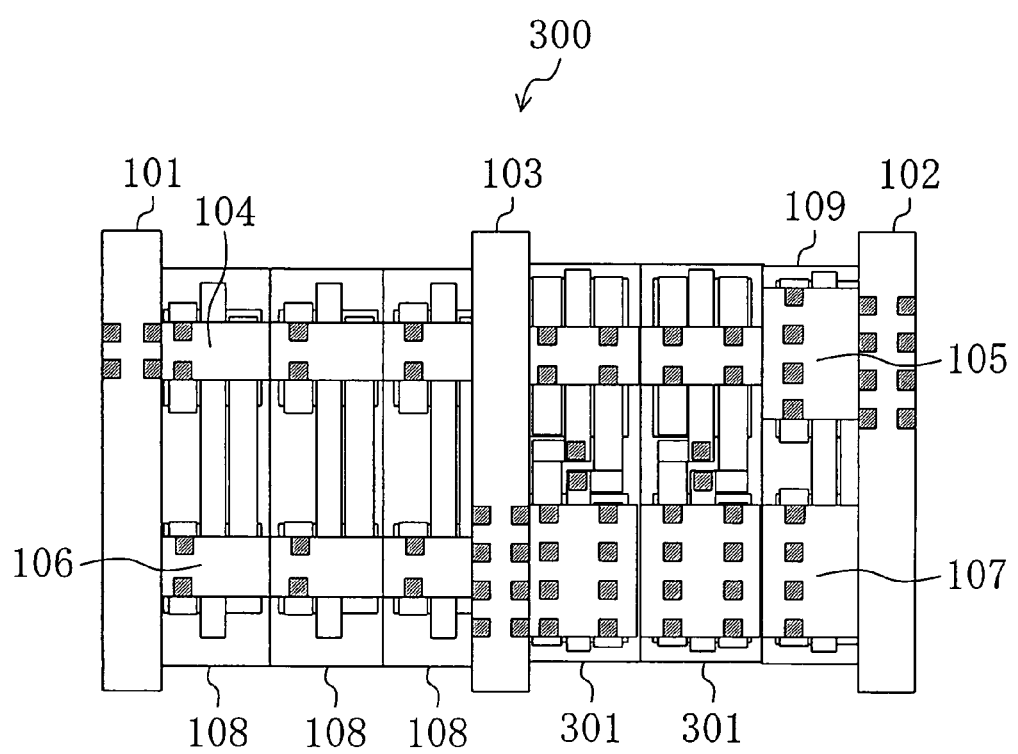
FIG. 6 is a layout diagram showing a structure of a semiconductor integrated circuit device according to a third embodiment of the present invention.

The position at which the second standard cell 109 driving the clock signal is placed is occasionally limited for the purpose of, e.g., eliminating skew. A semiconductor integrated circuit device 300 shown in FIG. 6 provides an example in which the position at which the second standard cell 109 is placed is limited to that adjacent to the second power source strap 102. In this example, the two decoupling capacitor cells 301 are arranged in parallel between the third power source strap 103 and the second standard cell 109. As a result, the width of the fourth cell power source line 107 is constant between the second and third power source straps 102 and 103, though the width of the second cell power source line 105 varies halfway.

Figure 7:
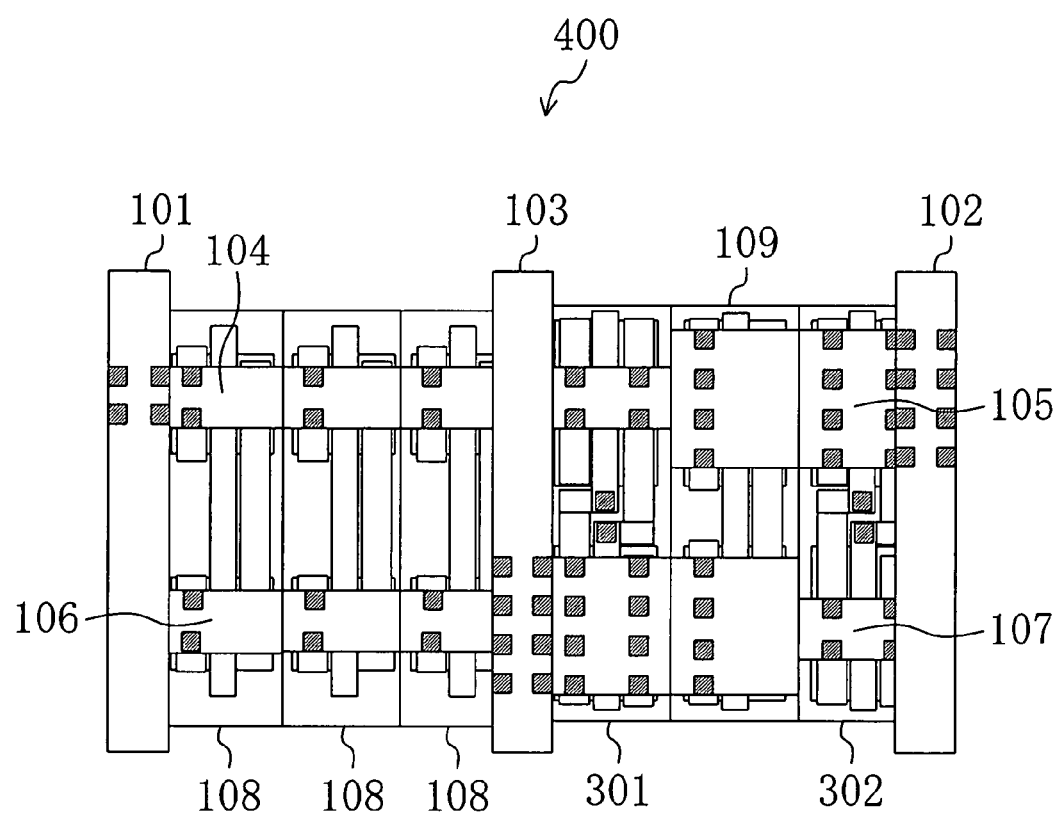
FIG. 7 is a layout diagram showing another structure of the semiconductor integrated circuit device according to the third embodiment.

A semiconductor integrated circuit device 400 shown in FIG. 7 provides an example in which decoupling capacitor cells are placed on both sides of the second standard cell 109. In this case, the decoupling capacitor cell 301 is placed on the side closer to the third power source strap 103 and the decoupling capacitor cell 302 is placed on the side closer to the second power source strap 102. As a result, the potential is supplied to the second standard cell 109 via the wider cell power source line. On the other hand, each of the second cell power source line 105 between the third power source strap 103 and the second standard cell 109 and the fourth cell power source line 107 between the second power source strap 102 and the second standard cell 109 has a smaller width. That is, the width of each of the second and fourth cell power source lines 105 and 107 varies halfway.

In the semiconductor integrated circuit devices 300 and 400, both of the first and second potentials are supplied to the high-load driving standard cells via the wider cell power source lines. Therefore, the current density in each of the cell power source lines to the high-load driving standard cells can be easily reduced. Since the decoupling capacitor cells do not consume higher power in each of the semiconductor integrated circuit devices 300 and 400, there is no problem even when the potentials are supplied to the decoupling capacitor cells via the cell power source lines which are not wider.

The cell power source lines which supply the potentials to the decoupling capacitor cells have portion thereof which are not wider. This allows the resulting vacant space to be used for other signal lines. As a result, a wider space can be provided for the other signal lines than in the semiconductor integrated circuit device 200.

Embodiment 4

In the fourth embodiment, a description will be given to a method for automatically designing each of the semiconductor integrated circuit devices according to the first, second, and third embodiments.

Figure 8:
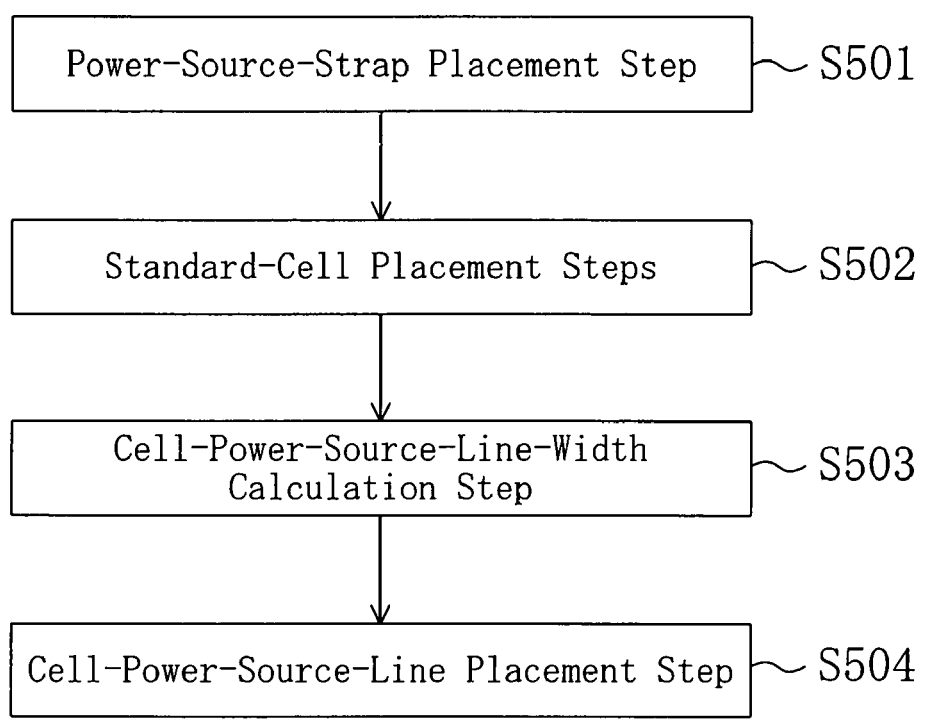
FIG. 8 is a flow chart illustrating a power source wiring method for automatically designing each of the semiconductor integrated circuit devices according to the first, second, and third embodiments.

FIG. 8 is a flow chart illustrating a power source wiring method for automatically designing each of the semiconductor integrated circuit devices according to the first, second, and third embodiments. The power source wiring method includes a power-source-strap placement step S501, a standard-cell placement step S502, a cell-power-source-line-width calculation step S503, and a cell-power-source-line placement step S504.

The processes in the individual steps are as follows.

First, in the power-source-strap placement step S501, the first, second, and third power source straps 101, 102, and 103 are placed in parallel in the same wiring layer to have the same wiring widths and equal wiring pitches.

Next, in the standard-cell placement step S502, the first standard cell 108 is placed between the first and third power source straps 101 and 103. Further, the second standard cell 109 is placed between the second and third power source straps 102 and 103.

In the cell-power-source-line-width calculation step S503, the respective widths of the first, second, third, and fourth cell power source lines 104, 105, 106, and 107 are determined in accordance with the power consumed by the first standard cells 108 and with the power consumed by the second standard cell 109.

Then, in the cell-power-source-line placement step S504, the first, second, third, and fourth cell power source lines 104, 105, 106, and 107 are placed to have the widths obtained in the cell-power-source-line-width calculation step S503 in orthogonal relation to the first power source strap 101 (i.e. in orthogonal relation to the second power source strap 102).

The high-load driving standard cell described in each of the foregoing embodiments is not limited to the inverter-type standard cell mentioned above. A buffer-type standard cell, an AND-type standard cell, or the like can also be listed as an example the high-load driving standard cell.

Although each of the foregoing embodiments has described the example in which the size of each transistor in the second standard cell 109 is larger than that of each transistor in the first standard cells 108 (low-load driving standard cell), it is also possible to construct the second standard cell 109 by, e.g., placing a plurality of transistors having the same sizes as those of the low-load driving standard cells in parallel and connecting the respective gates thereof to each other and the respective drains thereof to each other.

The relations among the potentials from the individual power source straps are only illustrative and are not limited to the example shown above.

Preferably, the first, second, and third power source straps 101, 102, and 103 are constructed to have the same wiring widths and equal wiring pitches. This allows the amounts of currents flowing in the individual power source straps to be averaged. As a result, it is possible to place a cell having large-size transistors, such as the second standard cell 109, either between the first and third power source straps 101 and 103 or between the second and third power source straps 102 and 103.

Thus, in the semiconductor integrated circuit device according to the present invention, the widths of the cell power source lines are determined in accordance with the power consumed by each of the standard cells and the potentials are supplied from the power source straps supplying the potentials to the standard cells receiving supplies of the potentials via the cell power source lines having the determined widths. As a result, the semiconductor integrated circuit device according to the present invention exerts the effect of allowing a large region to be provided for signals lines, while preventing electromigration by reducing the current density in each of the cell power source lines, and is therefore useful as a semiconductor integrated circuit device composed of standard cells arranged therein or the like.

What is claimed is:

1. A semiconductor integrated circuit device composed of standard cells arranged therein, the semiconductor integrated circuit device comprising:

a first power source strap supplying a first potential;

a second power source strap placed in parallel relation with the first power source strap and supplying a second potential;

a third power source strap placed between the first and second power source straps in parallel relation therewith and supplying a third potential;

a first standard cell placed between the first and third power source straps and driven with the first and third potentials;

a second standard cell placed between the second and third power source straps and driven with the second and third potentials;

a first cell power source line placed between the first and third power source straps in orthogonal relation to the first power source straps and supplying the first potential from the first power source strap to the first standard cell;

a second cell power source line placed between the second and third power source straps in orthogonal relation to the second power source strap and supplying the second potential from the second power source strap to the second standard cell;

a third cell power source line placed between the first and third power source straps in orthogonal relation to the first power source strap and supplying the third potential from the third power source strap to the first standard cell; and a fourth cell power source line placed between the second and third power source straps in orthogonal relation to the second power source strap and supplying the third potential from the third power source strap to the second standard cell, wherein the second standard cell has a transistor size larger than that of the first standard cell, the second cell power source line has a larger width than the first cell power source line, the fourth cell power source line has a larger width than the third cell power source line, the first and second cell power source lines are placed on a straight line, the third and fourth cell power source lines are placed on a straight line, and a wiring width of the first cell power source line between the first power source strap and the first standard cell, a wiring width of the second cell power source line between the second power source strap and the second standard cell, a wiring width of the third cell power source line between the third power source strap and the first standard cell, and a wiring width of the fourth cell power source line between the third power source strap and the second standard cell are each constant, wherein the wiring width of the fourth cell power source line is larger than the wiring width of the third cell power source line, the third and fourth cell power source lines are formed in the same wiring layer, the third power source strap is formed in a wiring layer different from the wiring layer in which the third cell power source line is formed, the third power source strap and the fourth cell power source line are connected to each other via contacts the number of which is in accordance with the wiring width of the fourth cell power source line, and the third cell power source line is connected to the third power source straps by sharing the contacts with the fourth cell power source line.

2. The semiconductor integrated circuit device of claim 1, wherein the first, second, and third power source straps are constructed to have the same wiring widths and equal wiring pitches.

3. The semiconductor integrated circuit device of claim 1, wherein the second standard cell consumes higher power than the first standard cell.

4. The semiconductor integrated circuit device of claim 1, wherein the second standard cell consumes higher power than the first standard cell and the only one second standard cell is placed between the second and third power source straps.

* * * * *